US 7,487,416 B2

(12) United States Patent
Oota

(10) Patent No.: US 7,487,416 B2
(45) Date of Patent: Feb. 3, 2009

(54) SELF TEST DEVICE AND SELF TEST METHOD FOR RECONFIGURABLE DEVICE MOUNTED BOARD

(75) Inventor: Yoshiyuki Oota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 387 days.

(21) Appl. No.: 11/451,053

(22) Filed: Jun. 12, 2006

(65) Prior Publication Data
US 2007/0234160 A1 Oct. 4, 2007

(30) Foreign Application Priority Data
Mar. 28, 2006 (JP) .............................. 2006-088796

(51) Int. Cl.
*G01R 31/28* (2006.01)
(52) U.S. Cl. ...................... 714/725; 714/733
(58) Field of Classification Search ................... 326/41; 714/724, 725, 733, 738
See application file for complete search history.

(56) References Cited

U.S. PATENT DOCUMENTS

| 5,844,917 | A | 12/1998 | Salem et al. |
| 5,991,907 | A | 11/1999 | Stroud et al. |
| 6,256,758 | B1 | 7/2001 | Abramovici |
| 6,574,761 | B1 | 6/2003 | Abramovici et al. |
| 7,024,660 | B2 * | 4/2006 | Andrade et al. ............. 717/124 |
| 7,287,189 | B1 * | 10/2007 | Johnson et al. ............. 714/725 |
| 7,345,507 | B1 * | 3/2008 | Young et al. ................... 326/41 |
| 2005/0071716 | A1 | 3/2005 | Montagne et al. |
| 2007/0011537 | A1 * | 1/2007 | Kiryu ......................... 714/733 |
| 2007/0234160 | A1 * | 10/2007 | Oota ........................... 714/733 |

FOREIGN PATENT DOCUMENTS

| JP | 57-135543 | 8/1982 |
| JP | 9-62534 | 3/1997 |
| JP | 2000-196555 | 7/2000 |
| JP | 2001-144261 | 5/2001 |

OTHER PUBLICATIONS

John York, et al., "Enhancement of MCM Testability Using an Embedded Reconfigurable FPGA", Oct. 8, 1997, pp. 165-173, 1997 Proceedings of the 2nd Annual IEEE International Conference on Innovative Systems in Silicon. ISIS '97. Austin, TX; Proceedings of the Annual IEEE International Conference on Innovative Systems in Silicon, New York, NY: IEEE, US.
Extended European Search Report and an Annex to the Extended European Search Report dated Aug. 21, 2007, for the corresponding European Patent Application EP 06 25 2900.

* cited by examiner

*Primary Examiner*—David Ton
(74) *Attorney, Agent, or Firm*—Katten Muchin Rosenman LLP

(57) ABSTRACT

A self test device includes an operational element determining unit that calculates, based on operation parameters for the time of operation of a board on which a reconfigurable device is mounted, operational elements used in the devices of the board for the operation, and non-operational elements; an element assignment determining unit that assigns a self-test target from among the non-operational elements; and a testing unit that makes a test signal transmit through a test path that passes through the test target.

20 Claims, 8 Drawing Sheets

FIG.2

| NUMBER OF OPERATIONAL ELEMENTS 201 | | | | | NUMBER OF OPERATIONAL BUSES 202 | | | | |
|---|---|---|---|---|---|---|---|---|---|
| INPUT DATA AMOUNT \ NUMBER OF USERS | 1 | 2 | .... | m | INPUT DATA AMOUNT \ NUMBER OF USERS | 1 | 2 | .... | m |
| 100 kbps | | | | | 100 kbps | | | | |
| ⋮ | | | | | ⋮ | | | | |
| 75 Mbps | | | | | 75 Mbps | | | | |

200

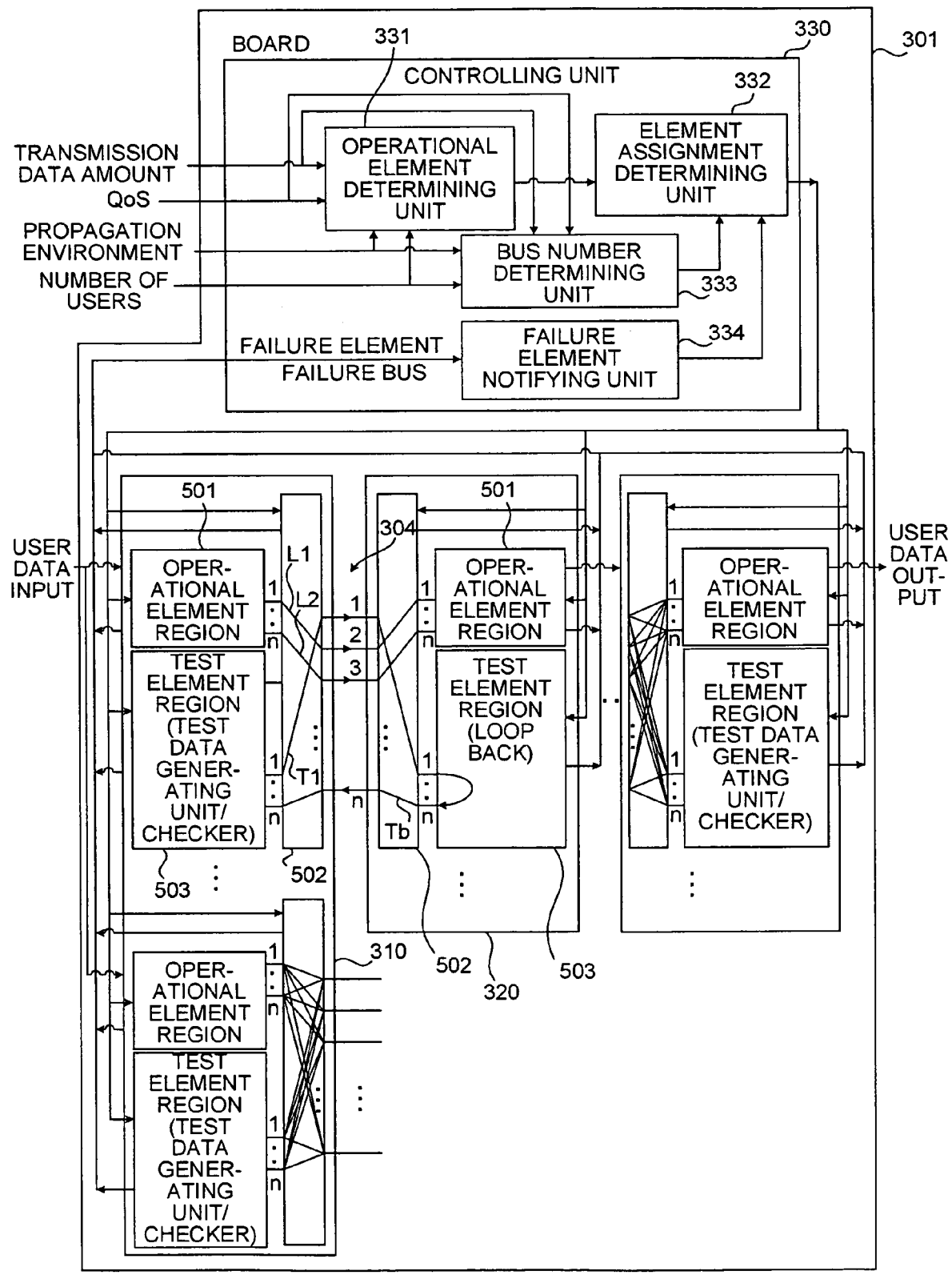

SELF TEST DEVICE AND SELF TEST METHOD FOR RECONFIGURABLE DEVICE MOUNTED BOARD

CROSS-REFERENCE TO RELATED APPLICATIONS

This application is based upon and claims the benefit of priority from the prior Japanese Patent Application No. 2006-088796, filed on Mar. 28, 2006, the entire contents of which are incorporated herein by reference.

BACKGROUND OF THE INVENTION

1. Field of the Invention

The present invention relates to a technology for a self test for diagnosing a reconfigurable device mounted on a board.

2. Description of the Related Art

Conventionally, in an apparatus that includes a board separated for each function and mounted on a shelf, a self test is performed for each board prior to putting the apparatus into an operating state or when the apparatus is in a test mode. If a result of the self test is satisfactory, the apparatus is put into the operating state, and if the result is unsatisfactory, another board having a satisfactory result is used to put the apparatus into the operating state.

As a conventional self test method, for example, following techniques have been disclosed. Japanese Patent Laid-Open Publication No. H9-62534 discloses a technology in which a self-diagnose, such as memory check, is performed utilizing an available time when no access exists for a predetermined period. Japanese Patent Application Laid-Open Publication No. 2000-196555 discloses a technology in which test data is input into a channel not being used among plural channels to detect a failure of the apparatus by comparing the output with expected values while other channels are used for data transmission. Japanese Patent Application Laid-Open Publication No. 2001-144261 discloses a technology for testing a field programmable gate array (FPGA) during operation thereof. In the technology, FPGA is divided into a normal operation work area and a self-test area, after the diagnosis in the self-test area is performed, a portion of the work area is set as the self-test area. Thus, by subsequently replacing a portion of the initial self-test area with the work area to diagnose the work area, FPGA can be tested even during the operation.

However, when the apparatus is put into the operating state, the self test for each board cannot be performed and when a failure occurs abruptly in the operating state, the operation is terminated. For example, if the apparatus is a radio apparatus, electric waves may not be transmitted, resulting in service termination.

In the technology disclosed in Japanese Patent Laid-open Publication No. H9-62534, the self diagnosis is performed for each fixed piece of hardware defined in advance and the self test cannot be performed for smaller unit of board segmented or for an element group on the board. Additionally, since the self diagnosis is performed in a spare time, the self diagnosis cannot be performed if the apparatus is continuously operated.

In the technology disclosed Japanese Patent Laid-Open Publication No. 2000-196555, unless the channel not being used is available, the self diagnosis cannot be started for a path from the channel to the output. Since this technology is for a multiplexing apparatus that multiplexes plural channels with a multiplexing channel switch, the self diagnosis can only be performed from each channel within a predetermined switching range. Even if an unsatisfactory result is detected for each channel, this detection is related only to a range of the input stage of the input select switch and an input processing unit for each channel, and, at the time of failure of the multiplexing channel switch at a subsequent stage, transmission through other channels cannot be continued as well.

In the technology disclosed in Japanese Patent Laid-Open Publication No. 2001-144261, since the normal operation work area and the self-test area are separated to perform the self-test, if the self-test area cannot be ensured, the self test cannot be started. A segment constituting the work region necessary for the normal operation is changed according to function and time, for example, based on the necessary data processing amount. However, the self-test area is not set corresponding to the changes in the segment constituting the work region, Therefore, if the data processing amount is increased, the self test is performed for the fixed self-test area, resulting in reduction of data processing efficiency, and the self test cannot be performed flexibly correspondingly to the operating state.

SUMMARY OF THE INVENTION

It is an object of the present invention to at least solve the above problems.

A self test device according to one aspect of the present invention performs a self test of a board on which a reconfigurable device is mounted. The self test is performed during an operation of the board. The self test device includes an element calculating unit configured to calculate operational elements to be used in a device of the board for the operation, and non-operational elements, based on operation parameters for a time of the operation of the board; an element assigning unit configured to assign an element to a self-test target from among the non-operational elements; and a testing unit configured to make a test signal transmit through a test path that passes through the self-test target to perform a test on the self-test target.

A method according to another aspect of the present invention is of performing a self test of a board on which a reconfigurable device is mounted. The self test is performed during an operation of the board. The method includes calculating operational elements to be used in a device of the board for the operation, and non-operational elements, based on operation parameters for a time of the operation of the board; assigning an element to a self-test target from among the non-operational elements; and performing a test by transmitting a test signal through a test path that passes through the self-test target to perform a test on the self-test target.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 illustrates a table of elements necessary for an operation;

FIG. 7 is a schematic for illustrating a loop back test.

DETAILED DESCRIPTION OF THE PREFERRED EMBODIMENTS

Exemplary embodiments according to the present invention will be explained in detail below with reference to the accompanying drawings. A reconfigurable device includes an FPGA, a complex programmable logic device (CPLD), a digital signal processor (DSP), etc. and is a device in which functions can be changed by making modification in software and firmware (by reconfiguration). The reconfigurable device mounted board includes plural devices.

Figure 1:
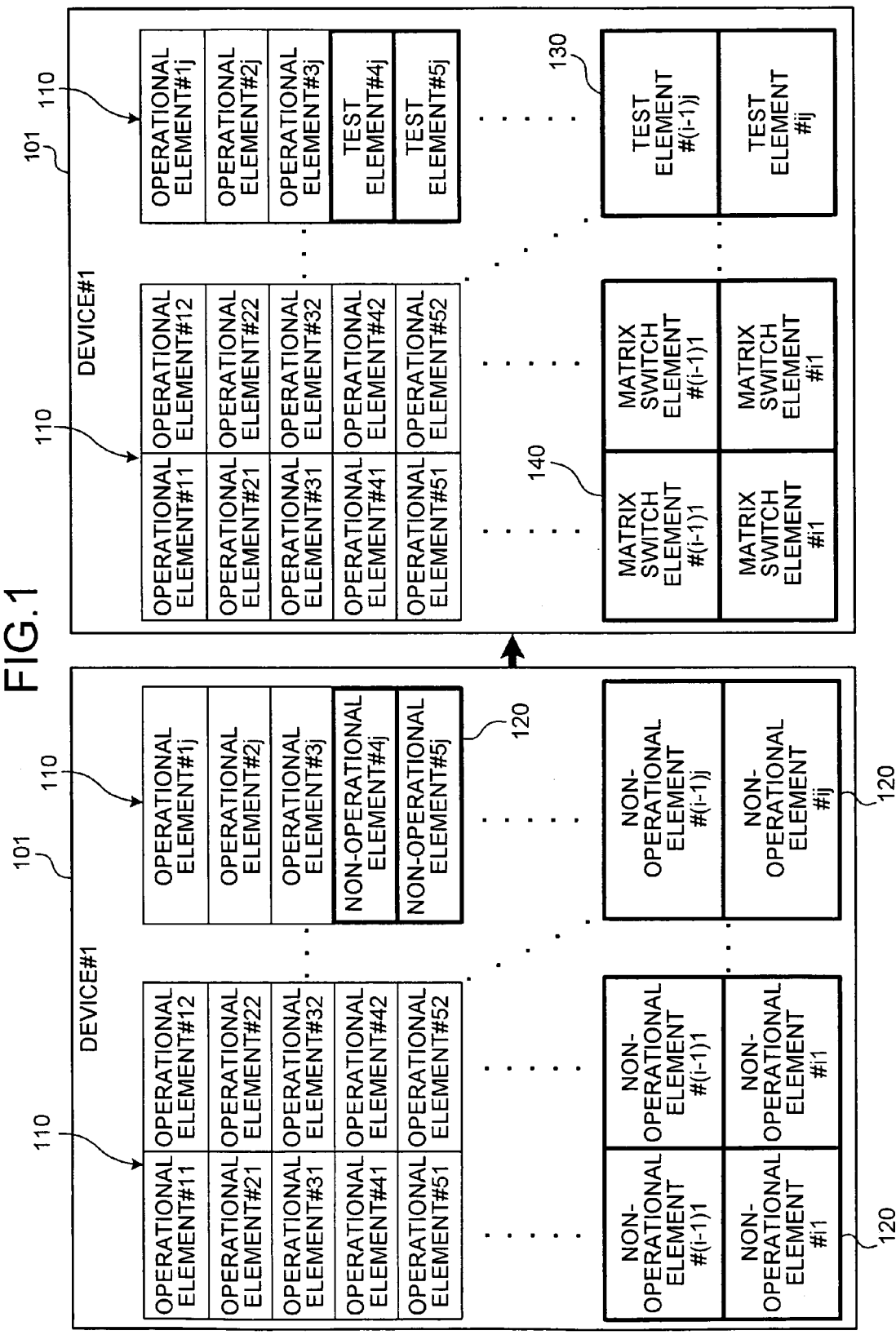
FIG. 1 is a schematic of a reconfigurable device mounted board for which a self-test device performs a self test according to embodiments of the present invention.

FIG. 1 illustrates a reconfigurable device mounted board self-tested by the self test device according to the embodiments of the present invention. A device #1 includes elements #i, j (i, j: matrix symbols) arranged in a matrix shape. An element indicates a minimum processing unit in a reconfigurable device where one device is constituted by grouping plural minimum processing units with a same function. Various types of the minimum processing unit may exist depending on the characteristics thereof. An example of the element includes cell and look up table (LUT) of FPGA.

In the present embodiment, the numbers of elements and buses necessary for operation are calculated for each device #1 based on operation parameters such as a transmission data amount, a quality of service (QoS), a propagation environment, the number of users, etc. The operated elements are operational elements 110. Elements other than operational elements 110 are non-operational elements 120. At the time of self-check, test elements 130 for the self-test and matrix switch elements 140 are configured and operated out of the non-operational elements 120.

The test elements 130 are changed periodically to prevent to be biased. When a failure is detected, a failure element and failure bus are bypassed to assign the operational elements 110, the test elements 130, and the matrix switch elements 140, which are reconfigured and operated continuously.

In the present invention, the non-operational elements 120 are detected and the self-test is performed for the non-operational elements 120. To avoid the bias in the group (block) of the elements selected for the test elements 130 and the matrix switch elements 140 from the non-operational elements 120, for example, the block is periodically changed to perform the self-test to the extent that the operation is not disturbed.

Description will be made of contents of preprocess necessary for performing the self-test.

(1) Calculation of Number of Elements Necessary for Operation

The number of elements necessary for operation is calculated by the following Equation 1, for example.

$$X=f(A, B, C, D) \tag{1}$$

where X is a function of operation parameters A, B, C, D, and X represents the number of operational elements, A represents a transmission request data amount or a transmission request rate, B represents a QoS value, which is an index value of data that must be transmitted immediately, and other data depending on types of data, C represents a propagation environment value, which is a propagation environment represented by numeric values from 1 to 30, for example, and D represents the number of users.

FIG. 2 illustrates a table of the elements necessary for operation. A table 200 includes tables of operational element number 201 and operational bus number 202. From the operational parameters of each device, i.e., the processed input data amounts and user numbers, the utilized operational element number 201 and the operational bus numbers 202 can be preliminarily obtained by simulation, etc. and stored into the table 200. The calculation result of the above Equation 1 may be stored into the table of the operational element number 201 shown in FIG. 2.

(2) Calculation of Number of Matrix Switch Elements

Since the operational element numbers in one device are calculated as in the above description (1), the calculation is performed for the number of the matrix switch elements, which are used for a matrix switch constituted by a plurality of devices arranged in a matrix shape. In the present invention, a plurality of devices is connected with the bus (BUS), and the self-test is performed for each element between input and output of each test path, a wire connection state on the device, and a connection state of the bus.

The number of elements necessary for the matrix switch is calculated by the following Equation 2, for example.

$$Y=f(a) \tag{2}$$

where Y is a function of a, Y represents the number of matrix switch elements, and a represents the number of connection bus between devices.

Since the calculation result of the Equation 2 is uniquely determined when the number of the buses is determined between the devices, the calculation result can be stored in the memory in advance.

(3) Calculation of Number of Test Elements

From the following Equation 3, the number of the test elements is calculated by subtracting the matrix switch element number of (2) from the operational element number of (1).

$$T=M-X-Y \tag{3}$$

where T represents the number of test element, Y represents the number of matrix switch elements, and M represents the maximum number of available elements of each device.

(4) Assignment of Test Elements, Bypassing of Failure Site, and Circulating

The assignment of the test elements is periodically performed to prevent certain elements from being assigned to the test elements many times.

1. Initially, the elements are assigned to the operational elements in ascending order of the element numbers, and the remaining elements are assigned to the test elements and the matrix switch elements.

2. One is added to the assignment amount of the element assigned to the test element.

3. The test element is assigned to the element with the smallest assignment amount of the element assigned to the test element among all the elements.

4. When a failure site, i.e., a failure element of failure bus is detected, the failure element number is not assigned with the operational element, test element, or matrix switch element.

5. When a failure is detected, an apparatus of an operation administration and maintenance (OAM) management system is externally notified of an alarm (ALM).

6. The processes of 1 to 5 are periodically repeated.

When the transmission data amount is increased and many users must be processed concurrently, since the number of the operational elements is increased and the assignment number of the test elements is correspondingly reduced, the test coverage is diminished.

Figure 3:
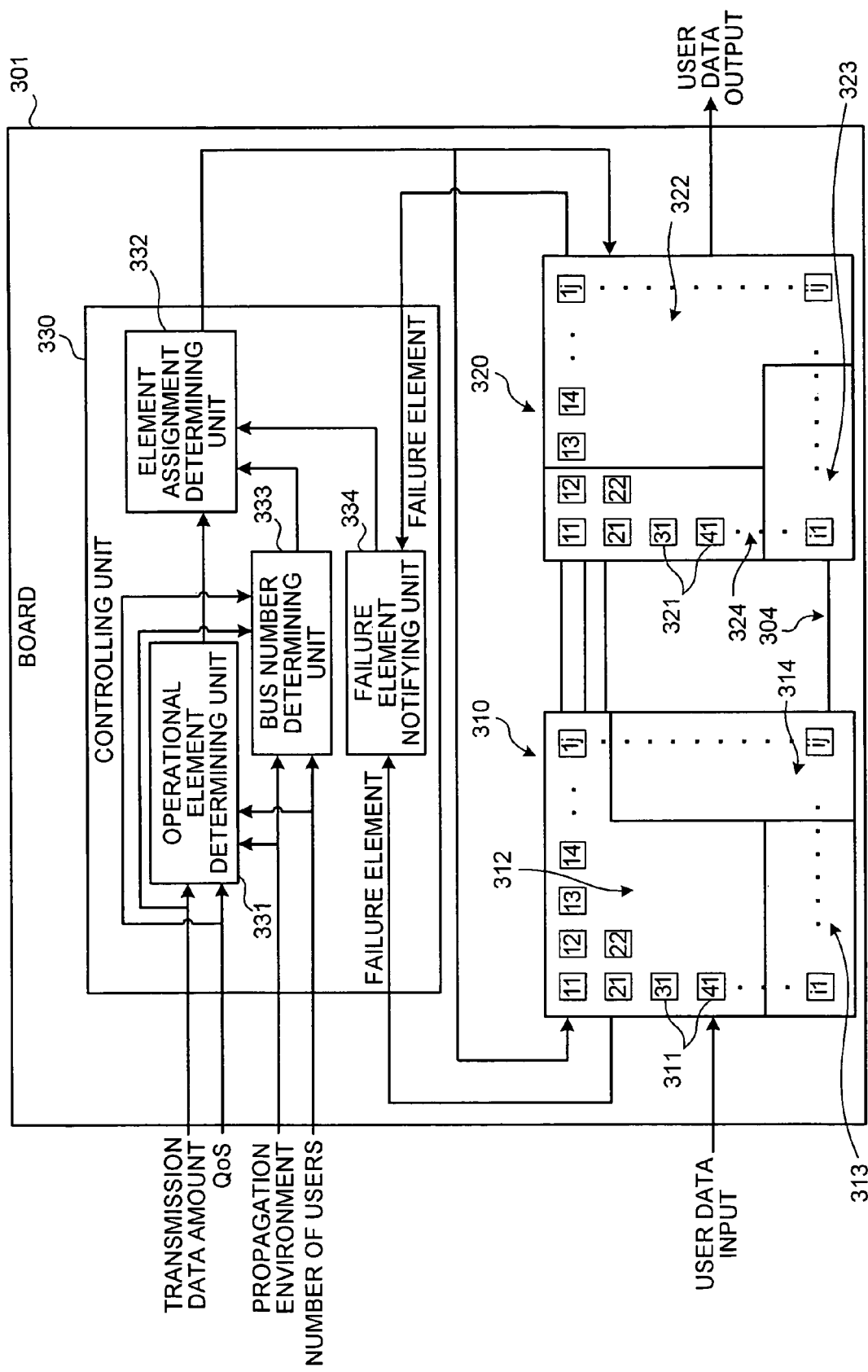
FIG. 3 is a block diagram of the self test device according to embodiments of the present invention.

FIG. 3 is a block diagram of the self test device. Reconfigurable devices, i.e., devices 310, 320 are mounted on a board 301. The board 301 including the devices 310, 320 is disposed as a function within a transmission apparatus that transmits user data. For example, the user data input to the device 310 is subjected to a signal process in the device 310, is sent out to the device 320 via a line 304, and is output as the user data.

In the self-test, the device 310 is a transmitting device of test signals and the device 320 is a receiving device. The devices 310, 320 include pluralities of elements 311, 321. The elements 311, 321 are assigned to operational elements 312, 322, test elements 313, 323, and matrix switch element 314, 324, as shown in FIG. 3, for example. Although the assignment is performed for each block region in the example of FIG. 3, the assignment can be performed when a grouped range such as a block does not exist (e.g., when line-shape test paths are crossing).

The board 301 is disposed with a controlling unit 330 for the self-test. The controlling unit 330 includes an operational element determining unit 331, an element assignment determining unit 332, a bus number determining unit 333, and a failure element notifying unit 334. The controlling unit 330 can be constituted by a computer function using elements.

Each of the operational element determining unit 331 and the bus number determining unit 333 receives input of operation parameter information such as the transmission data amount, the QoS, the propagation environment, the number of users, etc. The operational element determining unit 331 calculates and determines the operational element number of (1), the matrix switch element number of (2), and the test element number of (3) based on the operation parameters. The bus number determining unit 333 calculates and determines the number of the bus lines 304 between the devices 310, 320 based on the information of the transmission data amount, the QoS, the propagation environment, and the number of users. The bus number can be a bus number used when the operational element determining unit 331 calculates the matrix switch element number of (2).

The element allocation determining unit 332 performs the assignment of the test elements of (4) based on the operational element number and the bus number determined by the operational element determining unit 331 and the bus number determining unit 333. With the assignment of the test elements, the test path is generated by a plurality of test elements. When the failure element notifying unit 334 notifies the element allocation determining unit 332 of the failure site, the element allocation determining unit 332 does not assign the operational element, the test element, and the matrix switch element to the relevant failure element or failure bus to bypass the failure site. Similarly, the failure bus is not used.

A portion of the test elements 313, 323 acts as test unit for the self-test. The test unit includes a test data generating unit that generates test data and a test data checker that detects the test data through the test path. The test data generating unit inputs the test data to the input of the test path. The test data checker outputs the test data detection result from the output of the test path. In the example shown, information of the failure element and failure bus in the failure site is output.

When the information of the failure site is input based on the detection result of the test data checker, the failure element notifying unit 334 notifies the OAM management system apparatus of the alarm (ALM) and notifies the element allocation determining unit 332 of the information of the failure element or failure bus that is the failure site. The failure element notifying unit 334 may determine whether a failure occurs in the element (and bus) or not based on the detection result of the test data checker.

Figure 4:
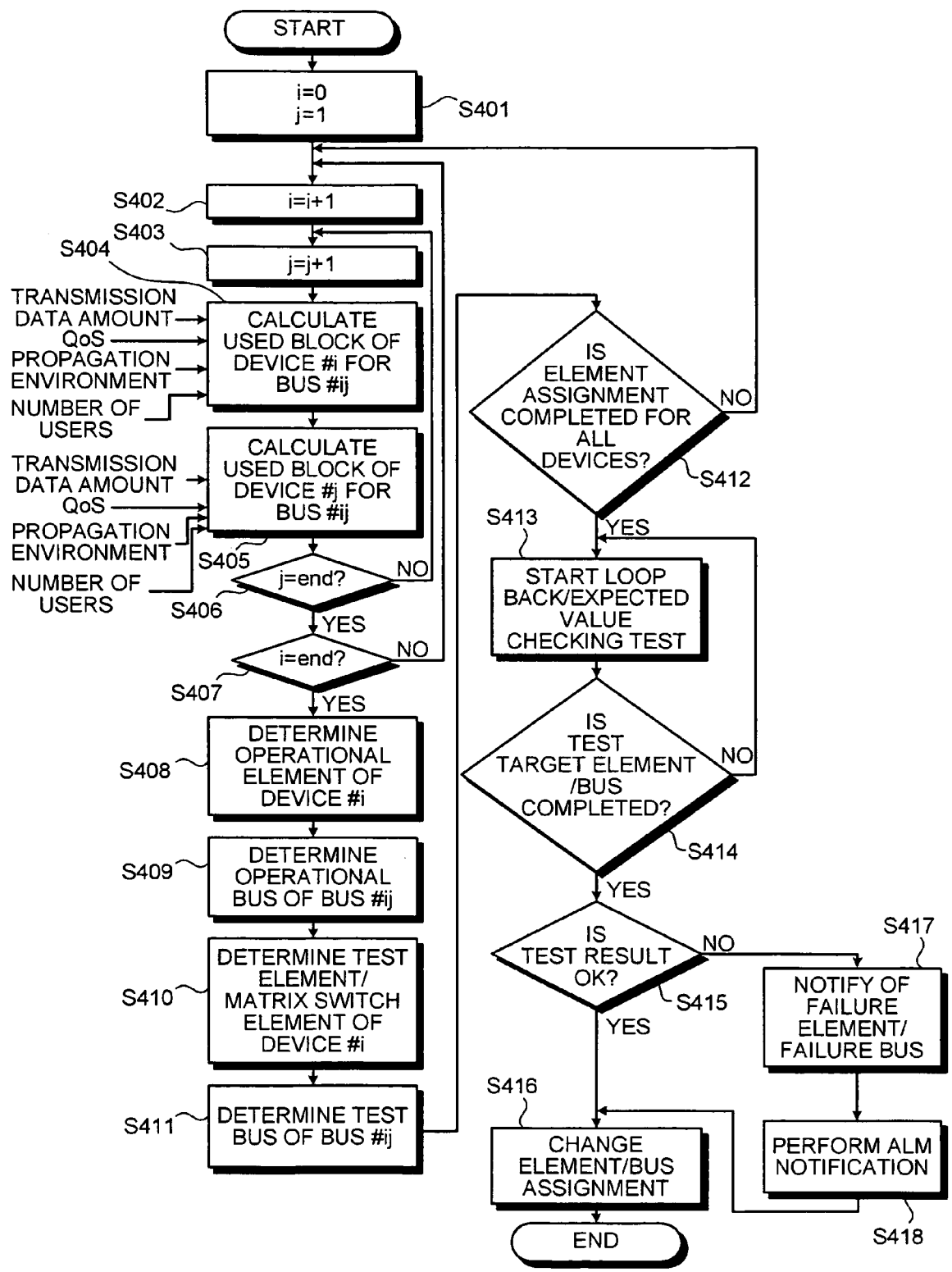
FIG. 4 is a flowchart of a self test by the self test device.

FIG. 4 is a flowchart of the self-test performed by the self test device. This process is performed by the controlling unit 330 of FIG. 3 and the self-test is performed for the test elements concurrently during the normal operation. In the following description, it is assumed for convenience that the used blocks (generic name of the operational elements 312, 322, the test elements 313, 323, and the matrix switch elements 314, 324) of the devices 310, 320 are formed for each function as shown in FIG. 3. Symbols i, j are used for matrix symbols and device numbers for representing the bus (BUS) numbers between devices. In the case of the configuration example of FIG. 3, since the device 310 is a first device, i=1 is defined; since the device 320 is a second device, j=2 is defined; and the number of the bus line 304 therebetween is BUS#ij=12.

First, for devices connected to each other on the test path of the self-test, initial values i=1 and j=2 are set as the device numbers i, j (step S401). The device number #1 is incremented by one (step S402) and the device number #j is incremented by one (step S403). The used blocks are calculated in one device #i connected to the bus (BUS) #ij (step S404) and the used blocks are calculated in the other device #j connected to the bus (BUS) #ij (step S405). As described above, the used blocks in steps S404, S405 are calculated based on the transmission data amount, the QoS, the propagation environment, the number of users (User), etc.

It is determined whether the used block calculation process is completed to the element at the end position on the device i (j=end) (step S406), and if not the device at the end position (step S406: NO), the procedure goes back to step S403 and the device number #j is incremented to perform the process again. If the process of the end-position element is completed (step S406: YES), it is determined whether the used block calculation process is completed to the element at the end position on the device j (i=end) (step S407), if not the device at the end position (step S407: NO), the procedure goes back to step S402 and the device number #i is incremented to perform the process again.

If the above process is completed to the end position of the device i (step S407: YES), the operational element determining unit 331 determines the operational element of the device number #1 (step S408) and the bus number determining unit 333 determines the operational bus of the bus number BUS#ij used correspondingly to the operational element (step S409). The element assignment determining unit 332 determines the test element and matrix switch element of the device number #i (step S410) and the test bus of the bus number BUS#ij (step S411).

It is then determined whether the element assignment is completed in all the devices (step S412). If the assignment is not completed (step S412: NO), the procedure goes back to step S402 to perform the process for the device where the assignment is not completed. If the assignment is completed (step S412: YES), the self-test is started (step S413). The self-test is performed by selecting a loop-back or expected value checking test.

It is determined whether the self-test is completed for the test-target elements and buses (BUS) on all the test paths (step S414), and if the self-test is not completed and the test path remains (step S414: NO), the test of step S413 is performed continuously. If the self-test is completed (step S414: YES), it is determined whether the test result of each test path is OK (step S415). If the test result is OK in all the test paths (step S415: YES), the assignment of the element and bus (BUS) is changed (step S416), and one self-test is completed as above. That is, if the test result is OK, the failure element notifying unit 334 notifies the element allocation determining unit 332 that the test result is OK, and the element allocation determining unit 332 changes the assignment of the element and bus (BUS). This allocation change is a reconfiguration request to the board 301 for periodical allocation described later. With the reconfiguration, the test path can be changed while the normal operation is continued on the board 301.

On the other hand, if the test result is NG in one test path (step S415: NO), the failure element notifying unit 334 performs a notification of the failure element or failure bus (BUS) where the failure occurs (step S417). In this notification, the alarm (ALM) is sent to the external management system apparatus (step S418) and the element allocation determining unit 332 is also notified of the failure element or failure bus (BUS). With this notification, the element allocation determining unit 332 bypasses the failure element or failure bus (BUS) of the notification to assign the operational element, the test element, and the matrix switch element (step S416), and one self-test is completed as above. This assignment at the time of the failure is a reconfiguration request to the board 301, and the normal operation can be continued on the board 301 by bypassing the failure element or failure bus (BUS) that is the failure site.

Figure 5A:
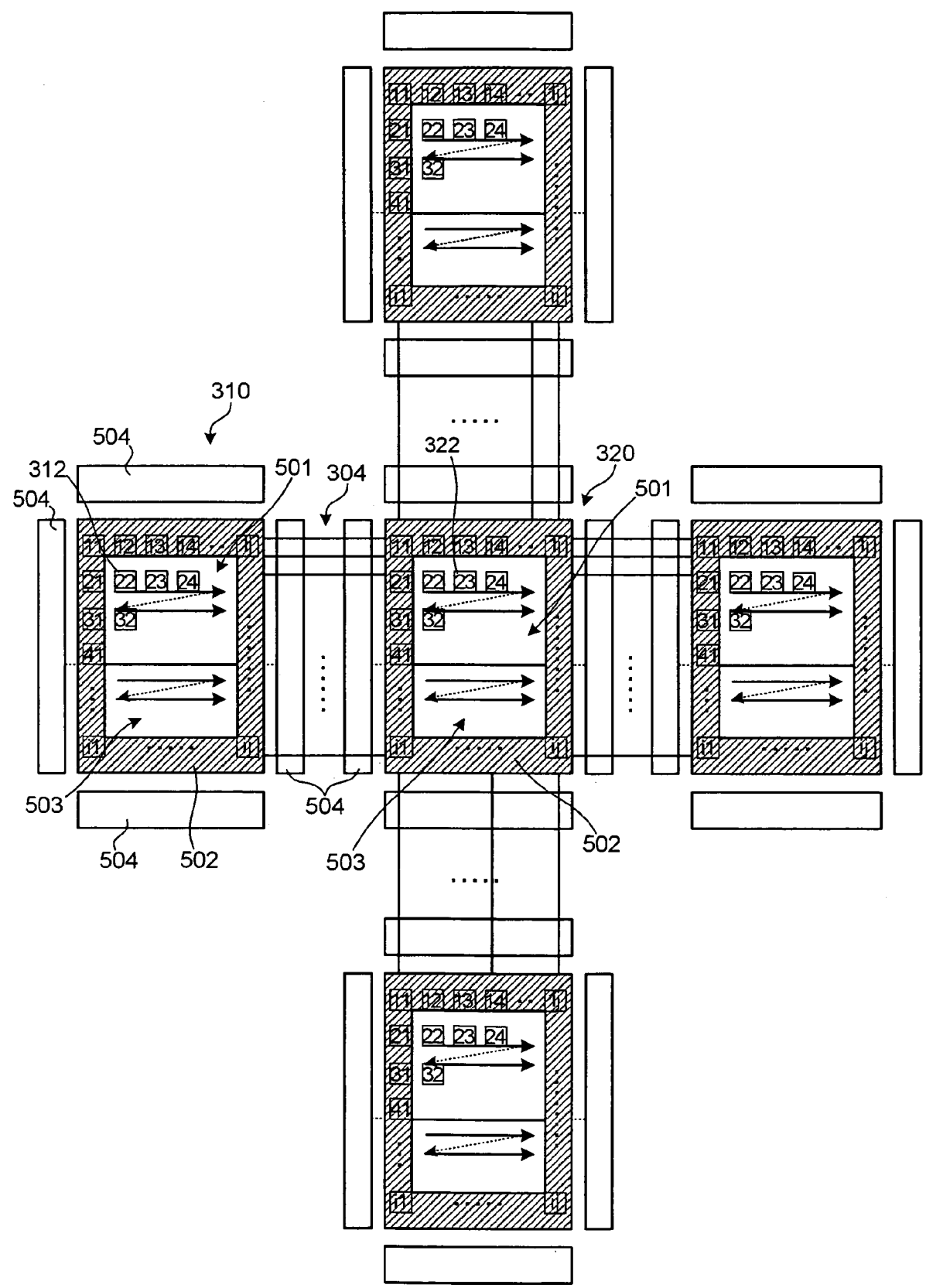
FIG. 5A is a schematic for illustrating assignment of an element and a bus.
Figure 5B:
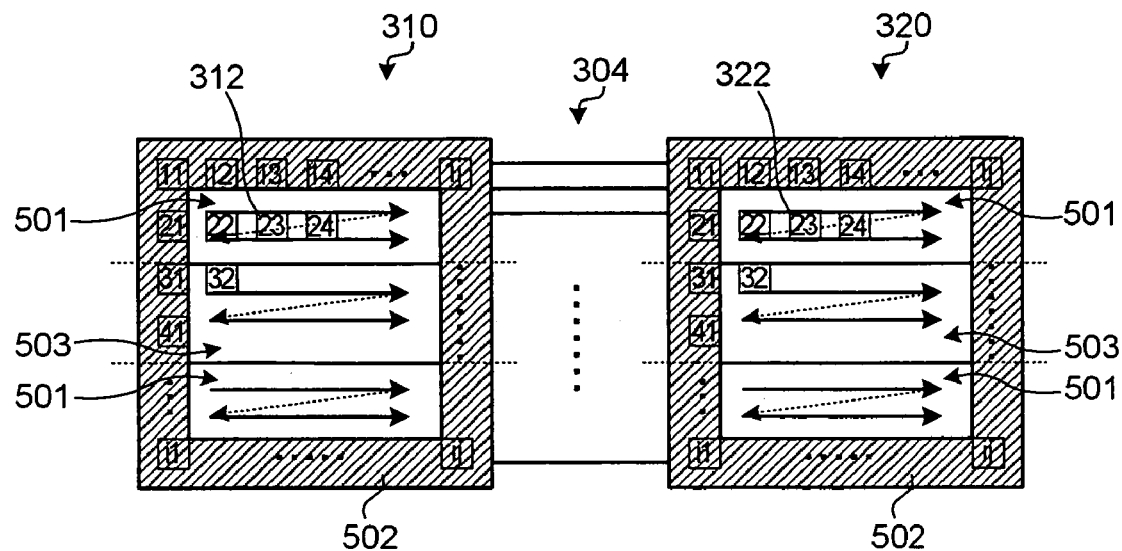
FIG. 5B is a schematic for illustrating the assignment of an element and a bus.
Figure 5C:
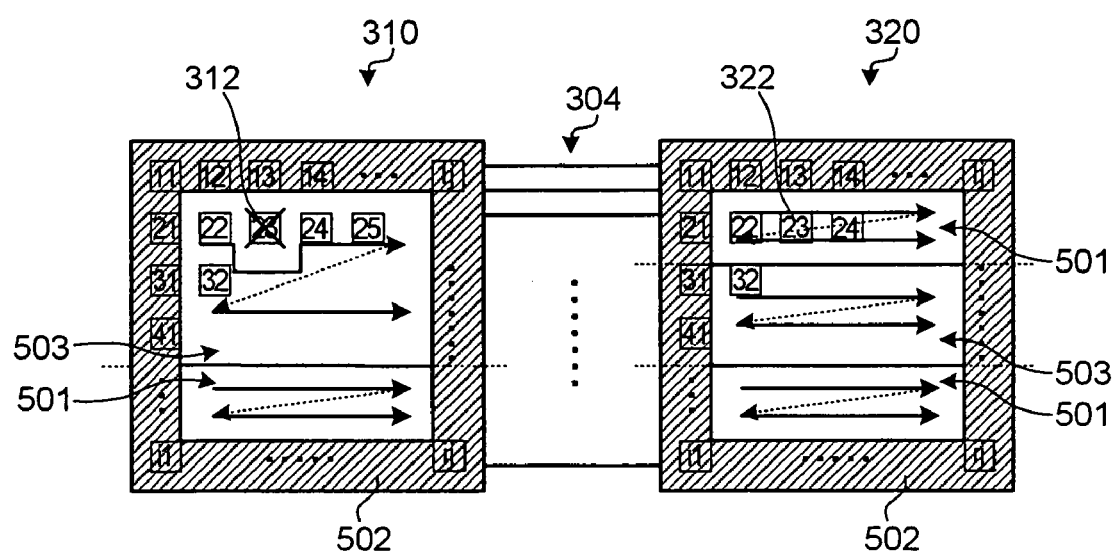
FIG. 5C is a schematic for illustrating the assignment of an element and a bus.

The element and bus assignment will be described specifically. FIGS. 5A to 5C are diagrams for describing the element and bus assignment. In FIGS. 5A to 5C, the same numerals are added to the components same as FIG. 3.

a) Periodical Assignment

The element allocation determining unit 332 calculates the number of the operational elements and the number of the matrix switch elements from the transmission data amount, the QoS, the number of users, etc., and as shown in FIG. 5A, the operational elements 312 are assigned to the elements sequentially from the top of a region (operational element region) 501 of FIG. 5A along the direction of an arrow. The matrix switch elements 314 are assigned sequentially from the top of a slanted-line region (matrix switch element region) 502 of FIG. 5A. The buses (BUS) 504 are assigned sequentially from the top. The assignment is performed depending on the location of the device 310 connected to the bus line 304, considering the direction (left, right, top and bottom) of the region 502 and the bus 504 that will be used. A remaining region 503 is assigned to a test element region for the test elements 311 where the self-test is performed. The test coverage can be improved by such periodical assignment.

After one self-test is completed, as shown in FIG. 5B, the region 501 of the operational elements 312 is changed. The assignment is performed within a range that satisfies the skew and the operation speed required for the normal operation.

b) Assignment When Failure Element/Failure Bus Occurs

Figure 6:
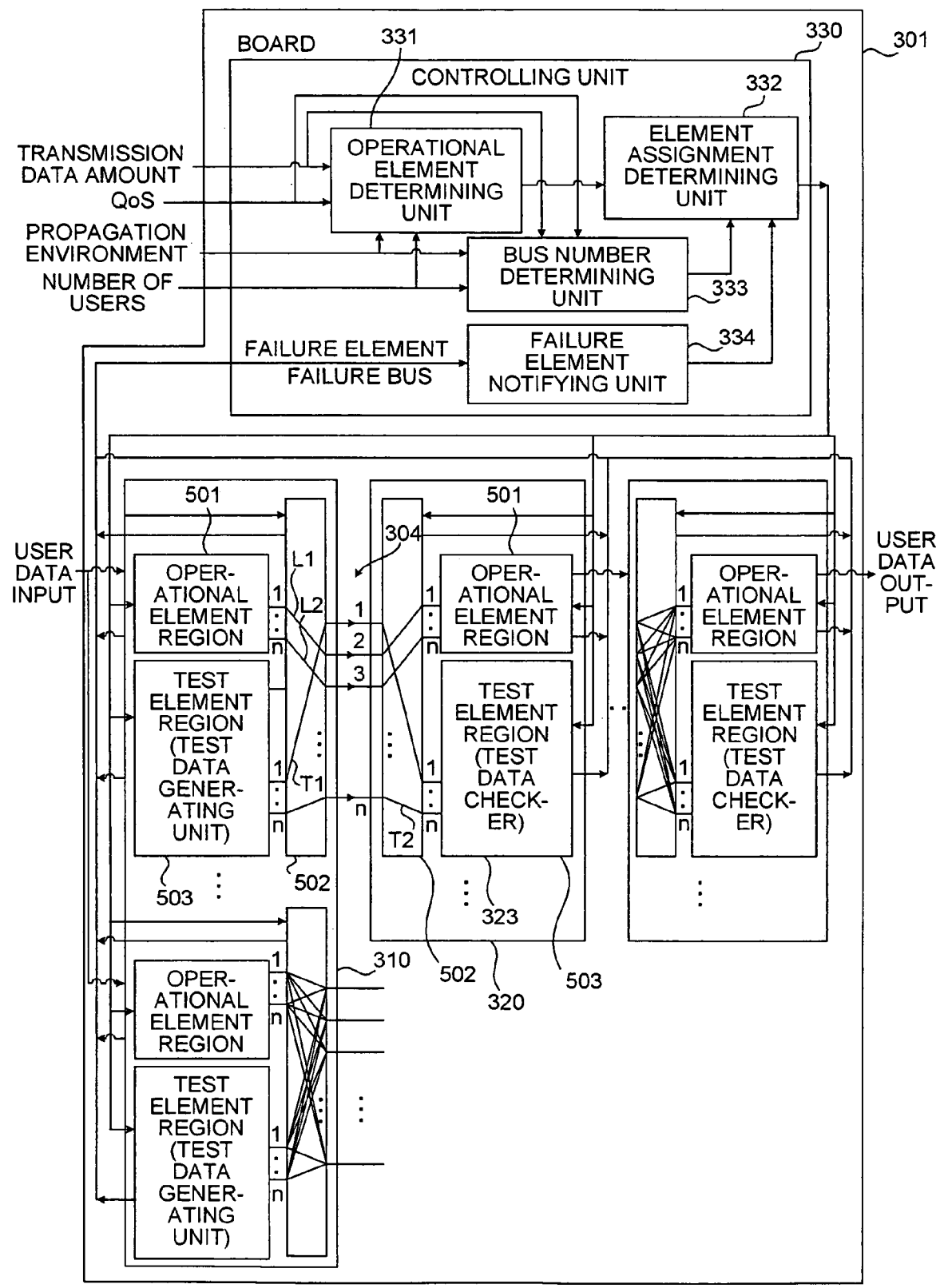
FIG. 6 is a schematic for illustrating an expected value checking test.

When a failure of the element or bus (BUS) occurs, the failure site is bypassed to assign the elements. In an example shown in FIG. 5-3, the element No. 23 is detected as a failure element and the element No. 23 is bypassed to FIG. 6 is a schematic for illustrating an expected value checking test as an example of the self-test. The same numerals are added to the components same as FIG. 3. Although the expected value checking test can be performed concurrently on a plurality of test paths in a plurality of devices shown in FIG. 6, description will be made of the case that the expected value checking test is performed on the test path between the device 310 and the device 320 for convenience. A plurality of elements disposed in each element region is not depicted.

The transmission data amount, the QoS, the propagation environment, the number of users, and the user data are input from the outside of the board 301. The user data are input to the device 310, and the transmission data amount, the QoS, the propagation environment and the number of users are input to the controlling unit 330. The controlling unit 330 performs the aforementioned control to output to the devices 310, 320 the information of the operational element numbers assigned to the operational elements, the test element numbers assigned to the test elements, the matrix switch element numbers assigned to the matrix switch elements, and the devices 310, 320 perform configuration.

The input user data are output to the outside through operation paths L1, L2 that are the operational element region 501 and the matrix switch element region 502 of the device 310, the bus lines 304 (bus Nos. #2 and 3) and the matrix switch element region 502 and the operational element region 501 of the device 320.

Through the aforementioned element assignment and the configuration of the devices 310, 320, test paths T1, T2 are set that are different from the operation paths L1, L2. The device 310 is allowed to act as a transmitting unit of the test data and the device 320 is allowed to act as a receiving unit of the test data. Therefore, some elements in the test element region 503 of the device 310 are allowed to act as a test data generating unit. A pseudorandom code such as PN9 or fixed pattern such as "0X55AA" is used for the test data (the expected value). On the other hand, some elements in the test element region 503 of the device 320 are allowed to act as a test data checker.

The test data flow through the test paths T1, T2 that are the test element region 503 and the matrix switch element region 502 of the device 310, the bus lines 304 (bus Nos. #1 and n) and the matrix switch element region 502 and the test element region 503 of the device 320. Therefore, the test targets are the test elements 313 for the test data generator of the transmitting device 310, the matrix switch elements 314 assigned to the test bus, the bus lines 304 (bus Nos. #1 and n) through which the test data flow, the matrix switch elements 324 assigned to the test bus of the receiving device 320, and the test elements 323 for the test checker.

The expected value is transmitted from the test elements (test data generating unit) 313 for the test data generator in the test element region 503 of the transmitting device 310. The test data are received by the test elements 323 (test data checker) for the test checker in the test element region 503 of the receiving device 320 to perform the expected value check against the transmitted expected value. If an error occurs as a result of the expected value check, the test data checker identifies the error location and notifies the failure element notifying unit 334 in the controlling unit 330 of the information of the failure element or failure bus to bypass the site.

FIG. 7 is a schematic for illustrating a loop back test as an example of the self-test. Although the loop back test can be performed concurrently on a plurality of test paths in a plurality of devices shown in FIG. 7, description will be made of the case that the loop back test is performed on the test path between the device 310 and the device 320 for convenience. In the loop back test shown, the transmitting device 310 transmits an expected value; the receiving device 320 performs LOOP BACK (returning); and the transmitting device 310 performs the expected value check.

The transmission data amount, the QoS, the propagation environment, the number of users, and the user data are input from the outside of the board 301. The user data are input to the device 310, and the transmission data amount, the QoS, the propagation environment and the number of users are input to the controlling unit 330. The controlling unit 330 performs the aforementioned control to output to the devices 310, 320 the information of the operational element numbers assigned to the operational elements, the test element numbers assigned to the test elements, the matrix switch element numbers assigned to the matrix switch elements, and the devices 310, 320 perform configuration.

The input user data are output to the outside through operation paths L1, L2 that are the operational element region 501 and the matrix switch element region 502 of the device 310, the bus lines 304 (bus Nos. #2 and 3) and the matrix switch element region 502 and the operational element region 501 of the device 320.

Through the aforementioned element assignment and the configuration of the devices 310, 320, loop-back test paths Ta, Tb are set which are different from the operation paths L1, L2. The test path from the device 310 to the device 320 is described as the test path Ta, and the test path returned from the device 320 to the device 310 is described as the test path Tb.

The transmitting unit and the receiving unit of the test data are disposed on the device 310. Therefore, some elements in the test element region 503 of the device 310 are allowed to act as the test data generating unit and the test data checker. In the test data element region 503 of the device 320, a loop back is formed to connect and loop back the test path Ta and the test path Tb. A pseudorandom code such as PN9 or fixed pattern such as "0X55AA" can be used for the test data (the expected value).

The test data flow through test path Ta that is the test element region 503 and the matrix switch element region 502 of one device 310, the bus line 304 (bus No. #1) and the matrix switch element region 502 and the test element region 503 of the other device 320. Subsequently, the test signal is returned by the loop back and flows through the test path Tb that is the test element region 503 and the matrix switch element region 502 of the other device 320, the bus line 304 (bus No. #n) and the matrix switch element region 502 and the test element region 503 of one device 310.

Therefore, the test targets are the test elements 313 for the test data generator of one device 310, the matrix switch elements 314 assigned to the test bus, the bus lines 304 (bus Nos. #1 and n) through which the test data flow, the matrix switch elements 324 assigned to the test bus of the other device 320, and the test elements 323 for the test checker.

The expected value is transmitted from the test elements (test data generating unit) 313 for the test data generator in the test element region 503 of the device 310. The test data are received by the test elements 323 (test data checker) for the test checker in the test element region 503 of this device 310 to perform the expected value check. If an error occurs as a result of the expected value check, the test data checker identifies the error location and notifies the failure element notifying unit 334 in the controlling unit 330 of the information of the failure element or failure bus to bypass the site.

Although description has been made of the test path between two devices 310, 320 connected with the bus line 304 in the example of each self-test described in the above embodiment, the numbers of target devices and buses of the self-test can be arbitrarily set.

Although the number of the operational elements is changed by changes in the transmission data amount etc. during the operation of the transmission device, since the test elements are assigned from the non-operational elements every time the number of the operational elements is changed, the self-test can be performed while the operation is continued without disturbing the operation, and a failure site can be detected rapidly.

Although description has been made of an example of a transmission device constituted by a reconfigurable device mounted board in the above embodiment, the self test device of the present invention is not limited to a transmission device, can be applied to various apparatus including a board on which a reconfigurable device is mounted, and can detect a failure site at an early stage.

The self-test method described in the embodiment can be realized by executing a prepared program with a computer. This program is recorded on a computer readable medium such as a hard disk, a flexible disk, a compact-disc read-only memory (CD-ROM), a magneto optical (MO) disk, a digital versatile disk (DVD), etc., and read from the recording medium and executed by a computer. This program may be a transmission medium that can be distributed through network such as the Internet.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A self test device that performs a self test of a board on which a reconfigurable device is mounted, the self test performed during an operation of the board, the self test device comprising:
   an element calculating unit configured to calculate non-operational elements and operational elements to be used in the reconfigurable device, based on operation parameters for a time of the operation of the board;
   an element assigning unit configured to assign, from among the non-operatioal elements, an element to a self-test target; and
   a testing unit configured to make a test signal transmit through a test path that passes through the self-test target to perform a test on the self-test target.

2. The self test device according to claim 1, wherein the operation parameters include an amount of data input to the board.

3. The self test device according to claim 1, further comprising a bus number calculating unit configured to calculate, based on the operation parameters, number of buses between devices, the buses necessary for the operation of the board, wherein
   the element assigning unit is configured to assign the test path that passes through the self-test target and the buses, by connecting devices with the buses based on the non-operational elements and the number of the buses.

4. The self test device according to claim 1, wherein the testing unit includes
   a test data generating unit configured to generate test data using elements located on the test path to send out to the test path; and
   a test checker configured to determine a failure site on the test path based on the test data received through the test path.

5. The self test device according to claim 4, wherein
   the test data includes a pseudorandom code and a fixed pattern, and
   the test checker is configured to acquire a test result based on an expected value of the test data.

6. The self test device according to claim 4, wherein
   the test data generating unit and the test checker are provided in a single device, and
   the testing unit is configured to perform a loop back test in which the test path passes through a second device other than the device on which the test data generating unit and the test checker are provided, and is returned at the second device.

7. The self test device according to claim 4, further comprising a failure notifying unit configured to notify the failure site to the element assigning unit and an external management apparatus based on a result of the test.

8. The self test device according to claim 1, wherein
the element assigning unit is configured to reassign, when a result of the test is satisfactory, another element to the self-test target from among the non-operational elements, and to request reconfiguration of the board.

9. The self test device according to claim 1, wherein
the element assigning unit is configured to reassign, when a result of the test is unsatisfactory, an operation path of the operational elements and the test path such that the failure site is bypassed, and to request reconfiguration of the board.

10. The self test device according to claim 1, wherein
the element assigning unit is configured to assign test elements and matrix switch elements to the self-test target from among the non-operational elements.

11. A method of performing a self test of a board on which a reconfigurable device is mounted, the self test performed during an operation of the board, the method comprising:
calculating non-operational elements and operational elements to be used in the reconfigurable device, based on operation parameters for a time of the operation of the board;
assigning, from among the non-operational elements, an element to a self-test target; and
performing a test by transmitting a test signal through a test path that passes through the self-test target to perform a test on the self-test target.

12. The method according to claim 11, wherein the operation parameters include an amount of data input to the board.

13. The method according to claim 11, further comprising:
calculating, based on the operation parameters, number of buses between devices, the buses necessary for the operation of the board; and
assigning the test path that passes through the self-test target and the buses by connecting devices with the buses based on the non-operational elements and the number of the buses.

14. The self test device according to claim 11, further comprising:
generating test data using elements located on the test path to send out to the test path; and
determining a failure site on the test path based on the test data received through the test path.

15. The method according to claim 14, wherein
the test data includes a pseudorandom code and a fixed pattern, and
the performing a test includes performing the test based on an expected value of the test data to obtain a test result.

16. The method according to claim 14, wherein
the generating and the determining are performed in a single device, and
the performing a test includes performing a loop back test in which the test path passes through a second device other than the device in which the generating and the determining are performed, and is returned at the second device.

17. The method according to claim 14, further comprising notifying the failure site based on a result of the test.

18. The method according to claim 11, further comprising:
reassigning, when a result of the test is satisfactory, another element to the self-test target from among the non-operational elements; and
requesting reconfiguration of the board.

19. The method according to claim 11, further comprising:
reassigning, when a result of the test is unsatisfactory, an operation path of the operational elements and the test path such that the failure site is bypassed; and
requesting reconfiguration of the board.

20. The method according to claim 11, wherein
the assigning an element includes assigning test elements and matrix switch elements to the self-test target from among the non-operational elements.

* * * * *